(12) United States Patent
Asou et al.

(10) Patent No.: US 7,670,960 B2
(45) Date of Patent: Mar. 2, 2010

(54) SUBSTRATE PROCESSING METHOD

(75) Inventors: Yutaka Asou, Ozu-Machi (JP); Masatoshi Shiraishi, Ozu-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 535 days.

(21) Appl. No.: 11/681,550

(22) Filed: Mar. 2, 2007

(65) Prior Publication Data
US 2007/0205181 A1 Sep. 6, 2007

(30) Foreign Application Priority Data
Mar. 3, 2006 (JP) ............... 2006-057518

(51) Int. Cl.
*H01L 21/302* (2006.01)
*H01L 21/461* (2006.01)
(52) U.S. Cl. ........................ 438/714; 216/41
(58) Field of Classification Search ................. 438/714; 216/41; 430/322
See application file for complete search history.

(56) References Cited
U.S. PATENT DOCUMENTS
2004/0126713 A1 7/2004 Shiraishi et al.

FOREIGN PATENT DOCUMENTS
JP 2003-158054 5/2003

*Primary Examiner*—Roberts Culbert
(74) *Attorney, Agent, or Firm*—Oblon, Spivak, McClelland, Maier & Neustadt, L.L.P.

(57) ABSTRACT

Disclosed is a substrate processing method that dissolves and deforms a photoresist film having a first pattern formed on a substrate to reshape the resist film into a second pattern. The method includes: evacuating a processing chamber, thereby reducing an internal pressure of the processing chamber from a standard pressure to a first target pressure lower than the standard pressure; introducing a solvent vapor-containing atmosphere into the processing chamber, thereby bringing the internal pressure back to the standard pressure; dissolving the resist film by a solvent contained in the solvent vapor-containing atmosphere; and evacuating a processing chamber, thereby reducing the internal pressure to a second target pressure higher than the first target pressure and lower than the standard pressure and discharging the solvent vapor-containing atmosphere from the processing chamber. Owing to the relatively low second target pressure, undesirable deformation of the resist film or defects in the resist film due to rapid evaporation of the solvent penetrated in the resist film can be prevented.

6 Claims, 9 Drawing Sheets

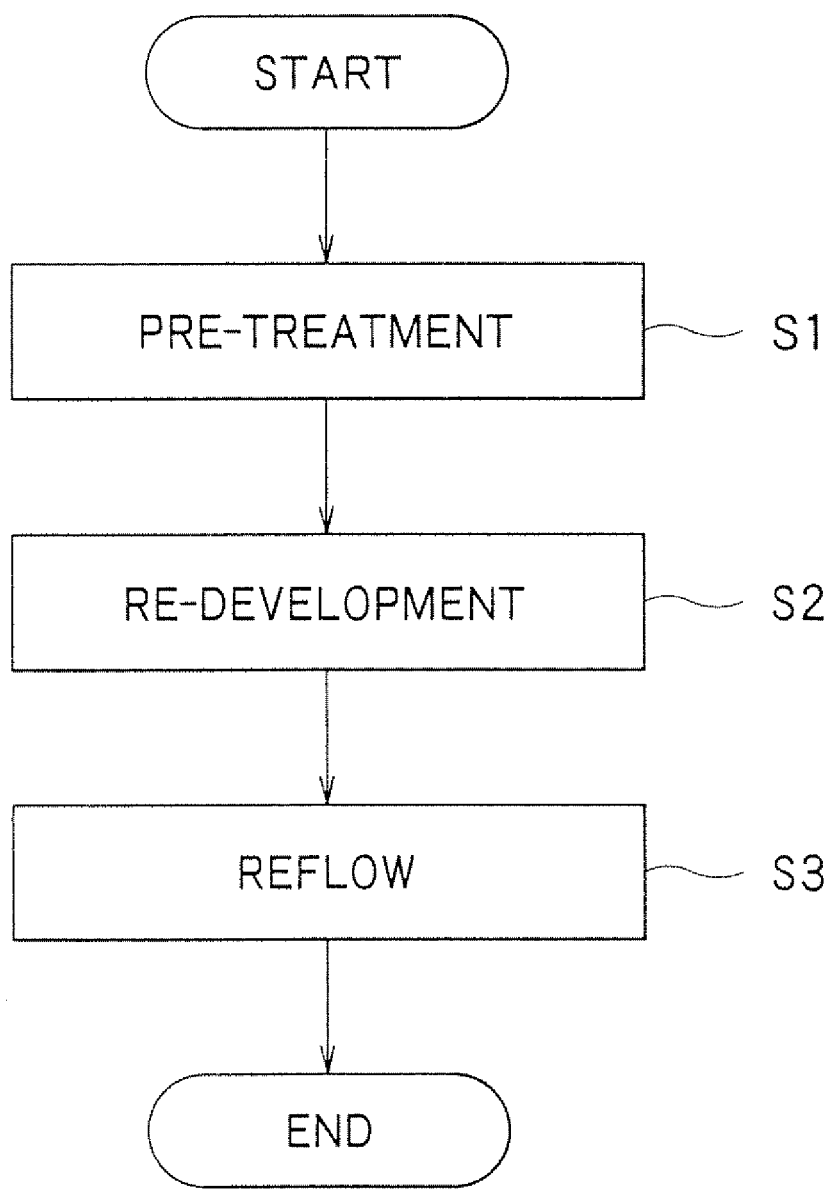
F I G. 3

SUBSTRATE PROCESSING METHOD

TECHNICAL FIELD

The present invention relates to a method of dissolving a resist film, having been made by photolithography and used as an etch mask, to reflow the resist film so as to reshape the same into a new pattern.

BACKGROUND ART

In amorphous silicon TFT (thin film transistor) forming processes included in an LCD (liquid crystal display) fabrication, an etching process must be carried out for plural times to achieve a complicated etching pattern associated with the TFT. Thus, with the conventional art, a photolithography process including an exposing process and a developing process is carried out for plural times corresponding to the number of the etching processes. Since different coating-and-developing apparatuses and exposure apparatuses are required for forming different patterns as etch masks, the total system cost is expensive.

As one solution of the above problem, a reflow process, which dissolves and deforms a resist film of a first pattern once used as an etch mask to reshape the same into a new, second pattern, attracts attention in these days. With the use of the reflow process, it is not necessary for forming the second resist pattern to perform processes employing a coating-and-developing apparatus and an exposure apparatus. The reflow process not only reduces the total system cost but also improves the production efficiency.

A series of processes for formation of an amorphous silicon TFT including a reflow process will be described with reference to FIG. 10. As shown in FIG. 10(a), on a gate electrode 201 formed on a glass substrate 200, an insulating layer 202, an Si-layer 203 composed of an a-Si layer (i.e., non-doped amorphous Si layer) 203a and an $n^+$a-Si layer (i.e., phosphor-doped amorphous Si layer) 203b, and a metal layer 205 for forming drain and source electrodes are stacked in that order.

Then, in order to perform a first etching process that etches the metal layer 205, a resist film 206 having a first pattern is formed on the metal layer by a photolithography process including a photoresist film forming step, an exposing step and a developing step. A half exposing technique is used in the exposing step so as to obtain the resist film 206 having thickness distribution (i.e., the resist film 206 has thick portions and thin portions.). The half exposing technique employs a half-tone mask having light-transmittance distribution. The half exposing technique is described in US2004126713A1 (JP2005-108904A), for example. The resist film 206 having the first pattern is used as a mask for etching the metal layer 205, and portions of the metal layer 205 which are not covered with the mask are etched and removed, as shown in FIG. 10(b).

Altered layer 207 is formed in the surface region the resist film 206 due to application of a wet etching liquid used for etching the metal layer 205. The altered layer 207 is removed by supplying thereto an alkaline solution, prior to a reflow process, as shown in FIG. 10(c).

Then, as shown in FIG. 10(d), portions of the resist film 206 which are not necessary for a second etching process (i.e., the thin portions of the resist film 206) are removed by re-developing process, while portions of the resist film 206 near targets Tg (i.e., the thick portions of the resist film 206) remain.

Then, the remaining resist film 206 as shown in FIG. 10(d) is exposed to a solvent vapor-containing atmosphere. Thereby, the resist film 206 dissolves and diffuses (i.e., reflow) to move onto the targets Tg to cover the same. Thus, the resist film 206 is reshaped into a second pattern, in other words, a second resist pattern is formed. Then, the Si layer 203 is etched by using the metal layer 205 and the resist film 206 as masks, as shown in FIG. 11(a); and the resist film 206 is removed, as shown in FIG. 11(b). Thereafter, the $n^+$a-Si layer 203 in channel regions is etched so that a TFT structure is formed, as shown in FIG. 11(d).

In the reflow process, the substrate contained in a processing chamber is exposed to a solvent vapor-containing atmosphere such a thinner gas-containing atmosphere, and the solvent that penetrates into the resist film dissolves the resist film. When supplying or discharging the solvent vapor-containing atmosphere into and from the processing chamber, the processing chamber is evacuated to reduce the internal pressure of the processing chamber from the standard pressure to a predetermined target pressure in order to improve the atmosphere replacement efficiency.

With the conventional art, the target pressure when introducing the solvent vapor-containing atmosphere into the processing chamber is the same as that when discharging the solvent vapor-containing atmosphere from the processing chamber; and the evacuating rate, or the pressure reducing rate, when introducing the solvent atmosphere is the same as that when discharging the solvent atmosphere. To be specific, as shown in FIG. 12, the pressure reducing rate is set to be high (e.g., 100 L/min in discharge rate), and the target pressure is set to be low (e.g., −90 kPa) to improve the atmosphere replacement efficiency. Note that, in this specification, the value of the "target pressure" is expressed as a differential pressure which is the target pressure minus the standard pressure. The standard pressure is typically atmospheric pressure.

In the second evacuating operation for discharging the atmosphere in the processing chamber, it is possible that the photoresist pattern may deform into an undesirable shape due to rapid evaporation of the solvent having penetrated in the resist film caused by rapid pressure reduction in the processing chamber. If the resist pattern is deformed, defects such as disconnections or short-circuits may be developed in the circuit pattern.

SUMMARY OF THE INVENTION

The present invention has been made in view of the foregoing circumstances, and it is therefore the object of the present invention to provide a method of reflowing a resist film, which is capable of preventing undesirable deformation of the resist film or defects in the resist film due to the atmosphere replacement operation.

In order to achieve the objective, according to the first aspect of the present invention, there is provided a substrate processing method that dissolves and deforms a photoresist film having a first pattern formed on a substrate to reshape the resist film into a second pattern. The method includes the steps of: evacuating a processing chamber holding therein the substrate, thereby reducing an internal pressure of the processing chamber from a standard pressure to a first target pressure lower than the standard pressure; introducing a solvent vapor-containing atmosphere into the processing chamber, thereby bringing the internal pressure back to the standard pressure; dissolving the resist film by a solvent contained in the solvent vapor-containing atmosphere; and evacuating a processing chamber, thereby reducing the internal pressure to a second target pressure higher than the first target pressure and lower than the standard pressure and discharging the solvent vapor-containing atmosphere from the processing chamber.

Preferably, the second target pressure minus the standard pressure is greater than −20 kPa.

In one preferred embodiment, a pressure reducing rate in the step of evacuating a processing chamber to reduce the internal pressure to the first target pressure is essentially identical to that in the step of evacuating a processing chamber to reduce the internal pressure to the second target pressure.

According to the second aspect of the present invention, there is provided a substrate processing method that dissolves and deforms a photoresist film having a first pattern formed on a substrate to reshape the resist film into a second pattern. The method includes the steps of: evacuating a processing chamber holding therein the substrate, thereby reducing an internal pressure of the processing chamber, at a first pressure reducing rate, from a standard pressure to a first target pressure lower than the standard pressure; introducing a solvent vapor-containing atmosphere into the processing chamber, thereby bringing the internal pressure back to the standard pressure; dissolving the resist film by a solvent contained in the solvent vapor-containing atmosphere; and evacuating a processing chamber, thereby reducing the internal pressure, at a second pressure reducing rate lower than the first pressure reducing rate, to the first target pressure and discharging the solvent vapor-containing atmosphere from the processing chamber.

According to the third aspect of the present invention, there is provided a substrate processing method that dissolves and deforms a photoresist film having a first pattern formed on a substrate to reshape the resist film into a second pattern. The method includes the steps of: evacuating a processing chamber holding therein the substrate, thereby reducing an internal pressure of the processing chamber from a standard pressure to a first target pressure lower than the standard pressure; introducing a solvent vapor-containing atmosphere into the processing chamber, thereby bringing the internal pressure back to the standard pressure; dissolving the resist film by a solvent contained in the solvent vapor-containing atmosphere; and discharging the solvent vapor-containing atmosphere from the processing chamber without reducing the internal pressure in the processing chamber.

BRIEF DESCRIPTION OF THE DRAWINGS

FIG. 3 is a flowchart showing processes performed in the reflow pattern forming apparatus shown in FIG. 1;

DESCRIPTION OF PREFERRED EMBODIMENTS

Preferred embodiments of the present invention will be described with reference to the attached drawings.

Figure 1:
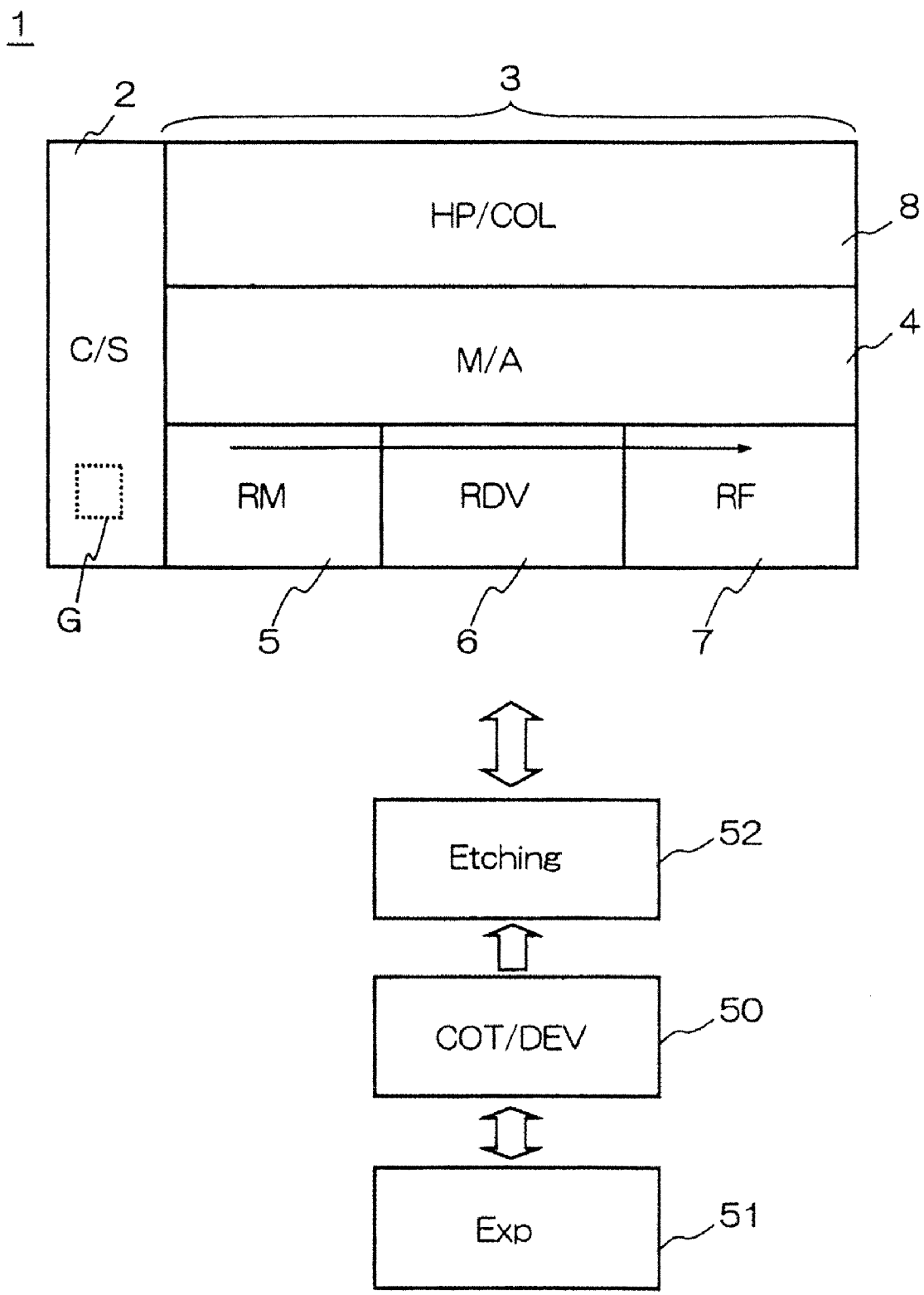
FIG. 1 is a schematic diagram showing the planar arrangement of a reflow pattern forming apparatus including a reflow unit that performs a reflow process according to the present invention.

As shown in FIG. 1, a reflow pattern forming apparatus 1, a coating-and-developing apparatus (COT/DEV) 50, an exposure apparatus (Exp) 51, and an etching apparatus 52 are provided in a factory. In a TFT fabrication, a resist (photoresist) film of a first pattern is formed on a substrate G by using the coating-and-developing apparatus 50 and the exposure apparatus (Exp) employing a photolithography process. Then, the substrate G is subjected to an etching process in the etching apparatus 52. Thereafter, the substrate is transferred to the reflow pattern forming apparatus 1, in which the substrate G having the resist film of a first pattern is subjected to a reflow process so that the resist film is reshaped into a second pattern.

The reflow pattern forming apparatus 1 is provided with a cassette station (C/S) 2, to and from which a cassette holding therein plural substrates G delivered from and to an external apparatus (e.g., the etching apparatus 52), and at which a substrate G is loaded and unloaded into and from a cassette.

A substrate processing block 3 is connected to the cassette station 2. Extends in the center portion of the substrate processing block 3A is a substrate transfer path 4, in which a substrate transfer arm (not shown) is arranged to load and unload a substrate G into and from respective substrate processing units arranged on both sides of the substrate transfer path 4 so as to transfer the substrate between the substrate processing units.

The substrate processing block 3 includes, as the substrate processing units, a remover unit (RM) 5, a re-development unit (RDV) 6, and a reflow unit (RF) 7, which are arrayed in that order on the right side of the substrate transfer path 4 along the substrate transfer direction as indicated by an arrow. A heat treatment unit (HP/COL) 3 having plural hot plates and cooling plates is arranged on the left side of the substrate transfer path 4. The task of the remover unit 5 is to perform a pre-treatment that removes an altered layer of a resist film. The task of the re-development unit 6 is to re-develop the resist film to remove therefrom unnecessary portion thereof. The task of the reflow unit 7 is to dissolve and deform the resist film so as to reshape the same into the second pattern, which will be described in detail hereinafter.

Figure 2:
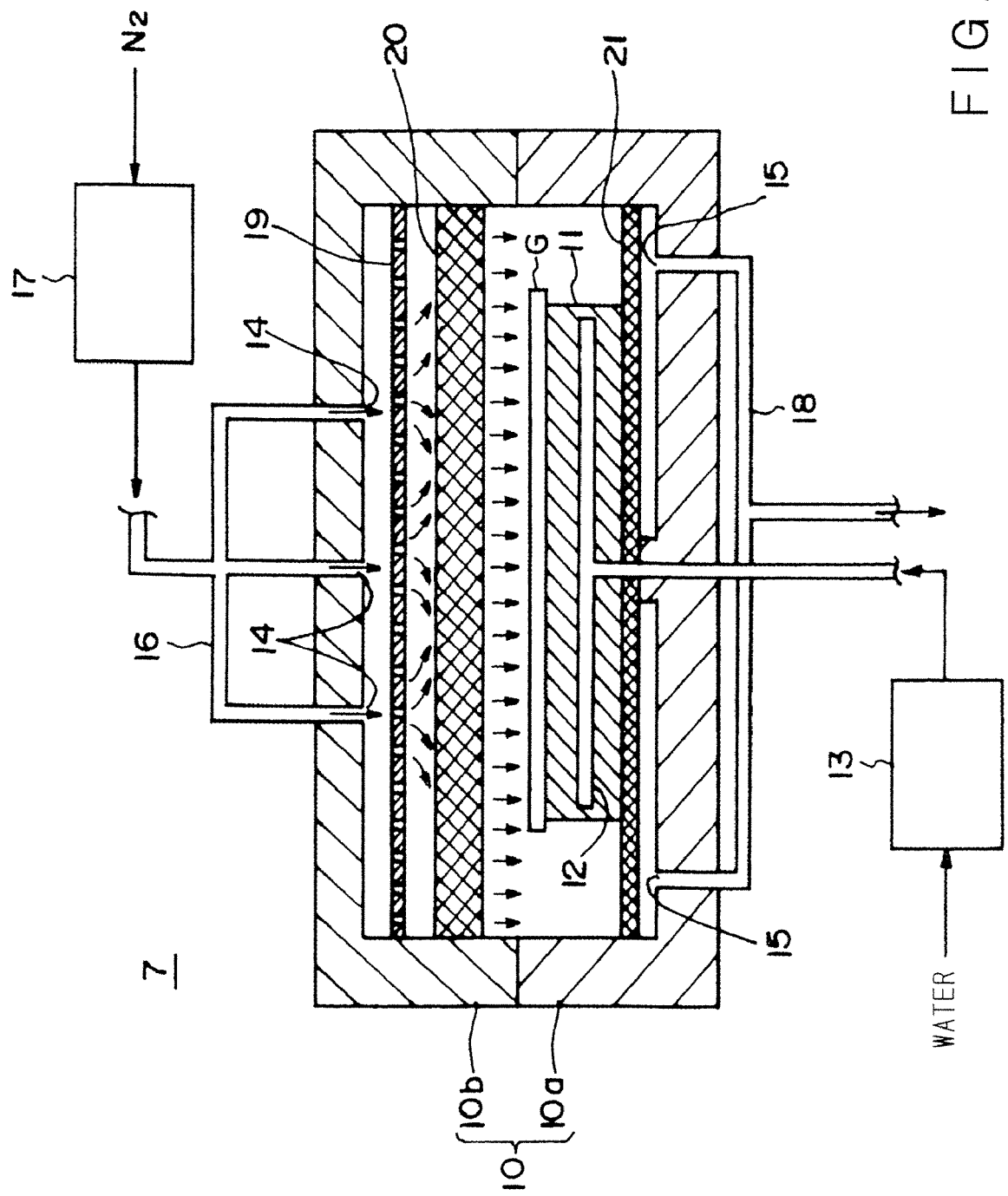
FIG. 2 is a cross-sectional view schematically showing the structure of the reflow unit shown in FIG. 1.

As shown in FIG. 2, the reflow unit 7 includes a processing chamber 10 having a base part 10a and an upper part 10b detachably engaged with the base part 10a to form a closed processing space.

At the center portion of the interior space of the processing chamber 10, a temperature adjusting plate 11 is disposed. The temperature adjusting plate 11 has a substrate support surface (i.e., the upper surface thereof) to support a substrate G thereon. A temperature control water passage 12 extends through the temperature adjusting plate 11. The temperature control water passage 12 is connected to a temperature regulator 13. Water is supplied into the temperature regulator 13, in which the temperature of the water is adjusted, and then the water is supplied into the temperature control water passage 12 in the temperature adjusting plate 11, thereby the temperature of the substrate support surface of the temperature adjusting plate 11 can be controlled at a target value, and the temperature of the substrate can be controlled at a desired value.

Plural gas supply holes 14 are formed in the top wall of the upper part 10b of the chamber 10 to supply the processing chamber 10 with a purge gas (e.g., $N_2$ gas) or a solvent vapor-containing atmosphere (i.e., a solvent vapor-containing gas) of a controlled solvent concentration. The gas supply holes 14 are connected through gas supply pipes 16 to a solvent concentration adjusting device 17. $N_2$ gas is supplied into the solvent concentration adjusting device 17, and is mixed with a solvent vapor, so that a solvent vapor-containing gas, i.e., an $N_2$ gas diluted-solvent vapor, may be supplied into the processing chamber 10 through the gas supply pipes 16 and the gas supply holes 14. The solvent concentration adjusting device 17 is configured to control the solvent concentration of the solvent vapor-containing gas, i.e., the mixing ratio of the solvent vapor and $N_2$ gas. In a typical embodiment, the solvent concentration of the solvent vapor-containing gas discharged from the solvent concentration adjusting device 17 is in the range of 50 to 100 vol. %. The solvent concentration adjusting device 17 is also configured so that it can discharge therefrom $N_2$ gas without containing a solvent vapor to purge the processing chamber 10. In order to achieve the above function, the solvent concentration adjusting device 17 may be provided therein with a solvent vaporizer (not shown), or a solvent vaporizer (not shown) may be connected to the solvent concentration adjusting device 17. The solvent is typically a thinner.

Plural gas discharge holes 15 are formed in the bottom wall of the bottom part 10a of the processing chamber 10. An evacuating system (not shown) is connected through gas discharge pipes 18 to discharge the atmosphere in the processing chamber 10. The not shown evacuating system includes a vacuum pump, a pressure regulating valve, a shutoff valve, and so on (not shown in the drawings). The evacuating system is controlled by a controller (not shown) so that a discharge rate at which the atmosphere in the processing chamber 10 is discharged therefrom, and/or a pressure reducing rate at which the pressure in the processing chamber is reduced, can be adjusted to a desired value.

In addition, the processing chamber 10 is provided therein with: a diffusion plate 19 having plural holes that diffuses a gas supplied through the gas supply holes 14 into the processing chamber 10; an equalizing plate 20 that equalizes the distribution of the flowing direction of the gas having been diffused by the diffusion plate 19; and a flow rectifying plate 21 that rectifies the gas flow flowing toward the gas discharge holes 15.

Figure 10:
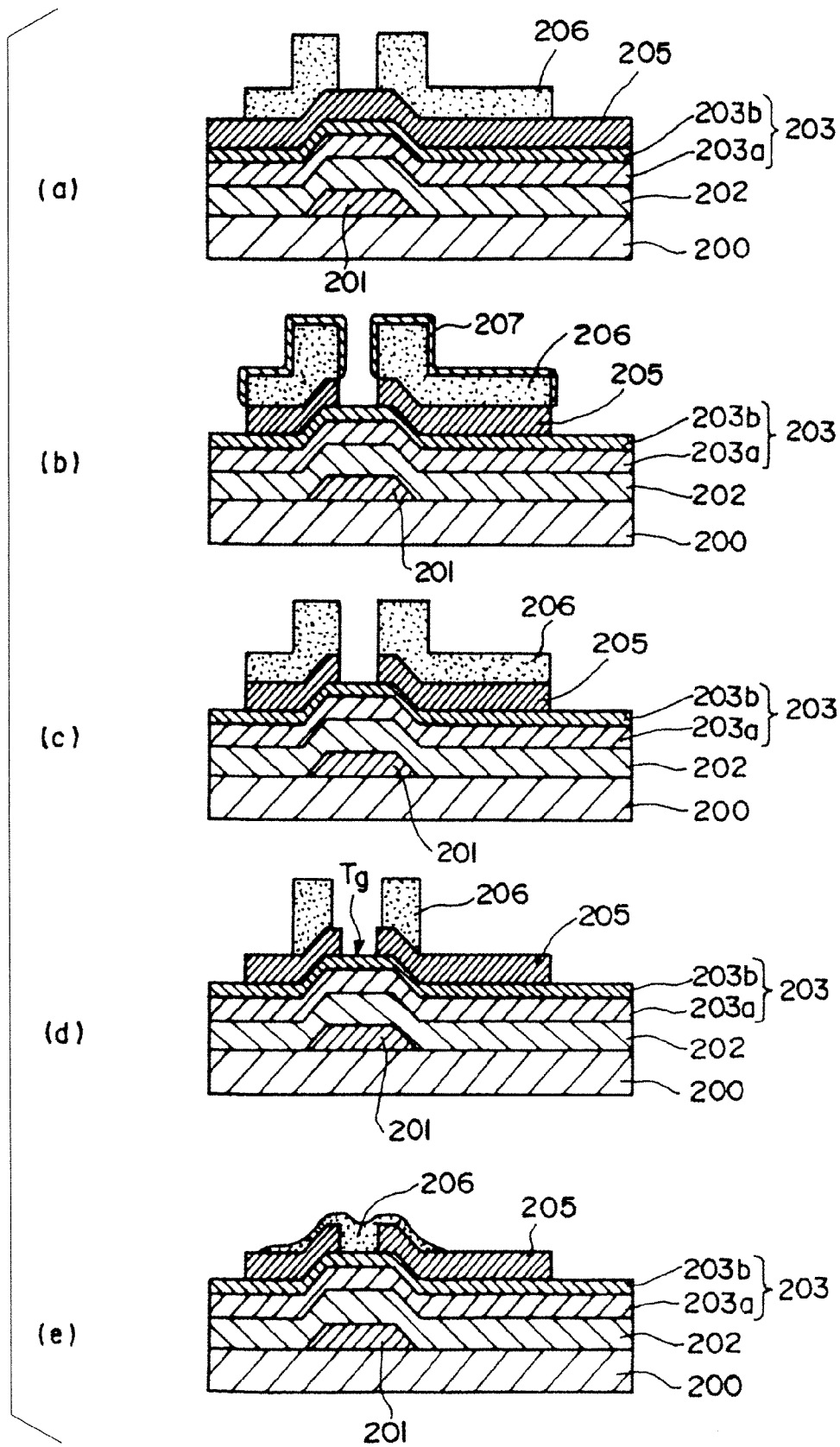
FIG. 10 is a cross-sectional view of a substrate for explaining a thin film transistor (TFT) fabricating processes including a reflow process.
Figure 11:
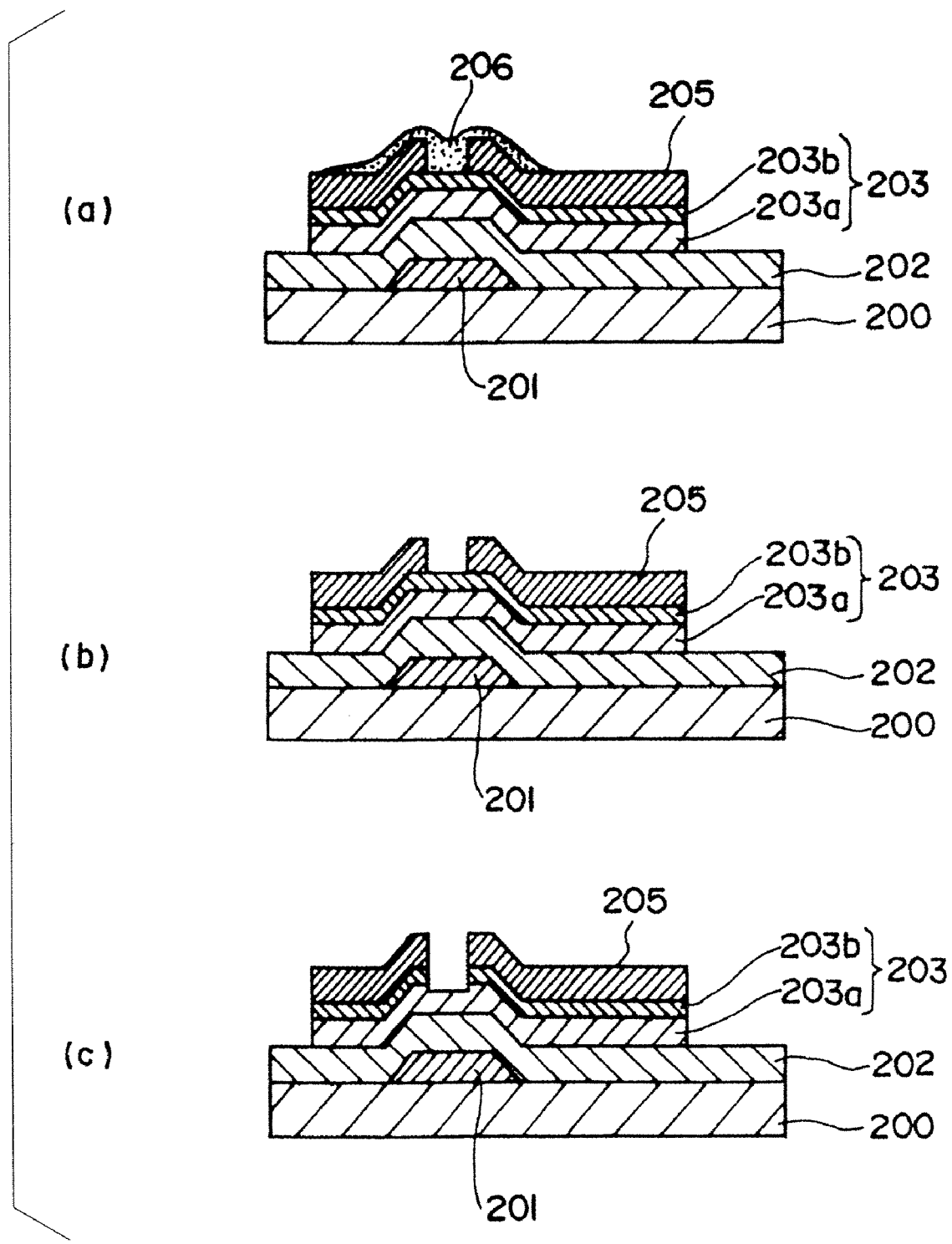
FIG. 11 is a cross-sectional view of the substrate for explaining the TFT fabricating processes succeeding the processes shown in FIG. 10.
Figure 12:
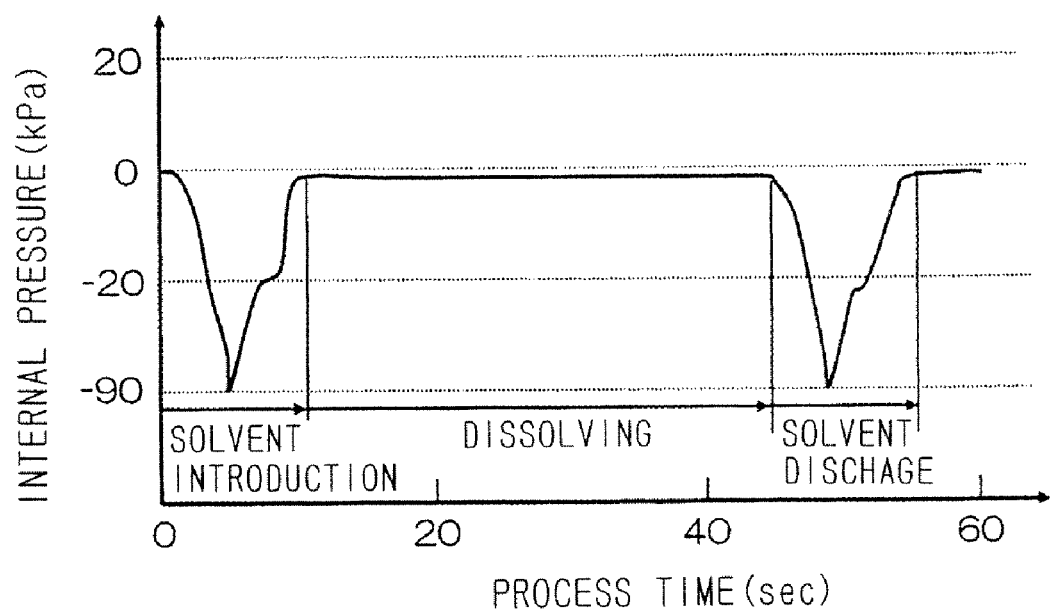
FIG. 12 is graph showing change in internal pressure in the processing chamber associated with a conventional reflow process.

Next, the operation of the reflow pattern forming apparatus 1 will be described with reference to the block diagram of FIG. 1, the flowchart of FIG. 3, and substrate cross-sectional views of FIG. 10.

A cassette holding substrates G is transferred from the etching apparatus 52 to the cassette station 2 of the reflow pattern forming apparatus 1. The arm 4 disposed in the substrate transfer path 4 takes a substrate G out of the cassette and transfers it to the remover unit 5. The resist film 206 has a first pattern for the etching process which was performed in the etching apparatus 52. Note that the substrate G has been subjected to a half exposure process in the exposure apparatus 51, and thus the resist film 206 has thin portions which are to be removed before the reflow process, and thick portions which are to remain and to be subjected to the reflow process, as shown in FIG. 10(a).

In the remover unit 5, as shown in FIG. 10(b), the substrate G is subjected to a pre-treatment, i.e., an etching process that removes an altered layer formed in the surface region of the resist (photoresist) film 206 by exposing the altered layer to an alkaline solution (step S1 in FIG. 3).

Then, the substrate G is transferred to the re-developing unit 6 by means of the arm in the substrate transfer path 4. In the re-developing unit 6, the substrate G is subjected to a re-developing process that removes unnecessary thin portions of the resist film 206, and thus only the thick portions of the resist film 206 remain on the substrate G, as shown in FIG. 10(d) (step S2 in FIG. 3). That is, the resist film 206 remains on the areas to be masked near targets Tg.

Then, the substrate G is transferred, by means of the arm in the substrate transfer path 4, to the heat treatment unit 6, in which the substrate G is subjected to a predetermined heat treatment. Then, the substrate G is transferred, by means of the arm in the substrate transfer path 4, to the reflow unit 7, in which the substrate G is subjected to a reflow process that dissolves and deforms the resist film 206 for a predetermined period of time, thereby the resist film 206 is reshaped into a second pattern that masks the targets G (step S3 in FIG. 3).

Then, the substrate G is transferred, by means of the arm in the substrate transfer path 4, to the heat treatment unit 6, in which the substrate G is heated so that the resist film 206 of the second pattern is fixed. Then, the substrate G is returned, by means of the arm in the substrate transfer path 4, to a cassette placed on the cassette station 2. Thereafter, the cassette holding the substrates G having been subjected the above series of processes in the reflow pattern forming apparatus 1 is transferred to the etching apparatus 52, in which each substrates G are subjected to the second etching process.

Next, the reflow process in the first embodiment will be described in detail with reference to the cross-sectional view of the reflow unit 7 of FIG. 2, a flowchart showing process steps of the reflow process of FIG. 4, and a graph showing the change in the internal pressure with time of FIG. 5.

First, the substrate G is placed on the temperature adjusting plate 11, and the temperature of the substrate support surface of the temperature adjusting plate 11 is adjusted to a predetermined value (e.g., 24° C.) by means of the temperature regulator 13. The upper part 10b of the processing chamber 10 sealingly engages with the bottom part 10a to form a closed processing space in the processing chamber 10.

Figure 4:
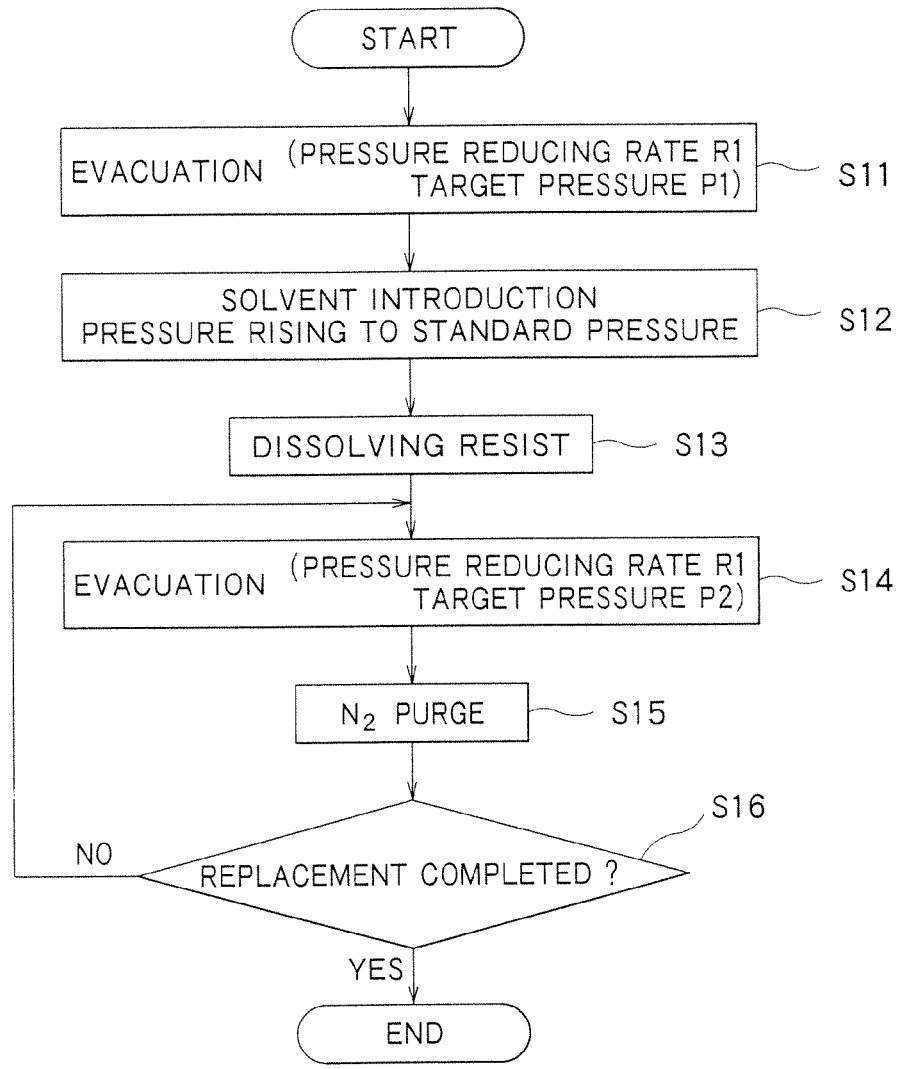
FIG. 4 is a flowchart showing process steps performed in the reflow unit of FIG. 2 in a first embodiment of the present invention.
Figure 5:
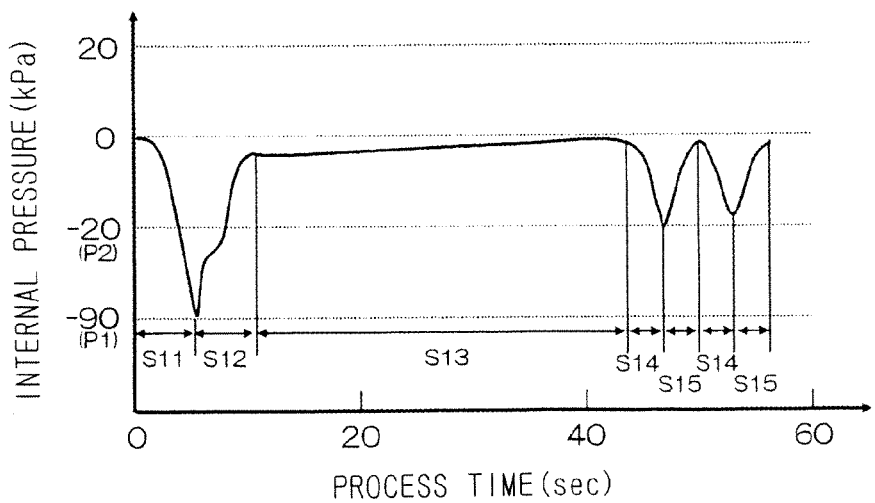
FIG. 5 is a graph showing change in internal pressure in the processing chamber associated with the process steps shown in FIG. 4.

Then, the evacuating system (not shown) evacuates the interior of the processing chamber 10 to reduce the internal pressure in the processing chamber 10 from the standard pressure (±0 kPa) to a first target pressure (e.g., −90 kPa), as shown in FIG. 5 (step S11 in FIG. 4). At this time, the controller of the evacuating system (not shown) controls the evacuating rate (i.e., discharge rate), or the pressure reducing rate, to achieve effective and rapid replacement of the atmosphere in the processing chamber 10. In the illustrated embodiment, the discharge rate R1 is 100 L/min.

After evacuating the processing chamber 10, a solvent vapor-containing atmosphere, e.g., a thinner vapor-containing gas, whose solvent concentration is adjusted by means of the gas concentration adjusting device 17 is introduced into the processing chamber 10, so that a solvent vapor-containing atmosphere is established in the processing chamber 10 and the pressure in the processing chamber 10 raises to be brought back to the standard pressure, as shown in FIG. 5 (step 12 in FIG. 4). According to the steps S11 and S12, the replacement of the atmosphere in the processing chamber 10 is completed.

Then, the substrate G is exposed to the thinner vapor-containing gas atmosphere established in the processing chamber 10 for a predetermined period of time, thereby the resist film on the substrate G is dissolved and deformed (i.e., reflow) to be reshaped into the second shape (step S13 in FIG. 4).

Then, the thinner vapor-containing gas atmosphere in the processing chamber 10 is discharged therefrom by means of the not shown evacuating system (step S14 in FIG. 4). At this time, the discharge rate R1, or the pressure reducing rate, in step S13 is set to be identical to that in step S11, while the target pressure (i.e., second target pressure P2) in step S13 is higher than that (i.e., first target pressure P1) in step S11. In other words, the second target pressure P2 is closer to the standard pressure than the first target pressure P1. In detail, the second target pressure P2 is determined such that evaporation of the solvent, or the thinner, having penetrated in the resist film is suppressed, thereby undesirable deformation of the resist film and/or development of defects in the resist film can be prevented. In the illustrated embodiment, the second target pressure P2 is −20 kPa.

As shown in FIG. 5, when the internal pressure of the processing chamber 10 reaches the second target pressure P2, N$_2$ gas is supplied into the processing chamber 10 so that the pressure in the processing chamber 10 returns to the standard pressure (step S15 in FIG. 4). Step S14 and step S15 are repeated alternately until the completion of the substitution of N$_2$ gas atmosphere for the thinner-vapor containing atmosphere (step S16 in FIG. 4).

According to the foregoing embodiment, as the first target pressure P1 in step S11 is relatively low, rapid introduction of the solvent vapor-containing atmosphere into the processing chamber 10 is possible, which contributes to improvement in throughput; and, as the second target pressure P2 in step S14 is relatively high, undesirable deformation of the resist film and/or development of defects in the resist film can be prevented, and thus defects such as disconnections and short-circuits in the circuit pattern can be avoided.

Next, the reflow process in the second embodiment will be described in detail with reference to the cross-sectional view of the reflow unit 7 of FIG. 2, a flowchart showing process steps of the reflow process of FIG. 6, and a graph showing the change in the internal pressure with time of FIG. 7.

Figure 6:
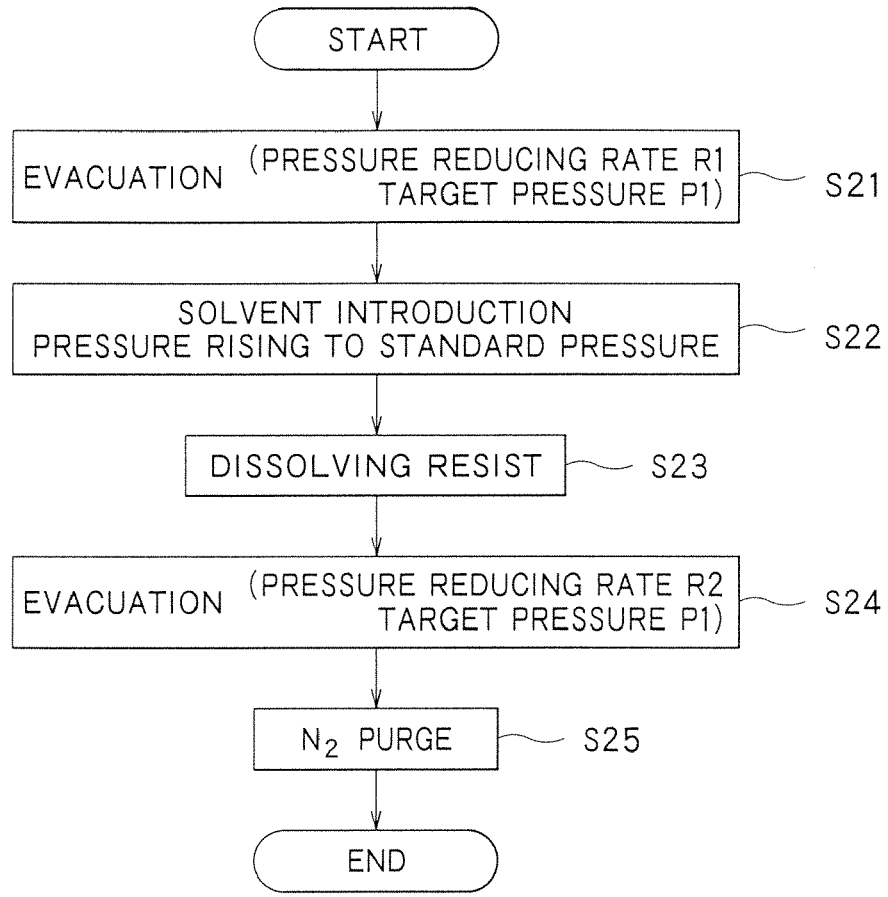
FIG. 6 is a flowchart showing process steps performed in the reflow unit of FIG. 2 in a second embodiment of the present invention.
Figure 7:
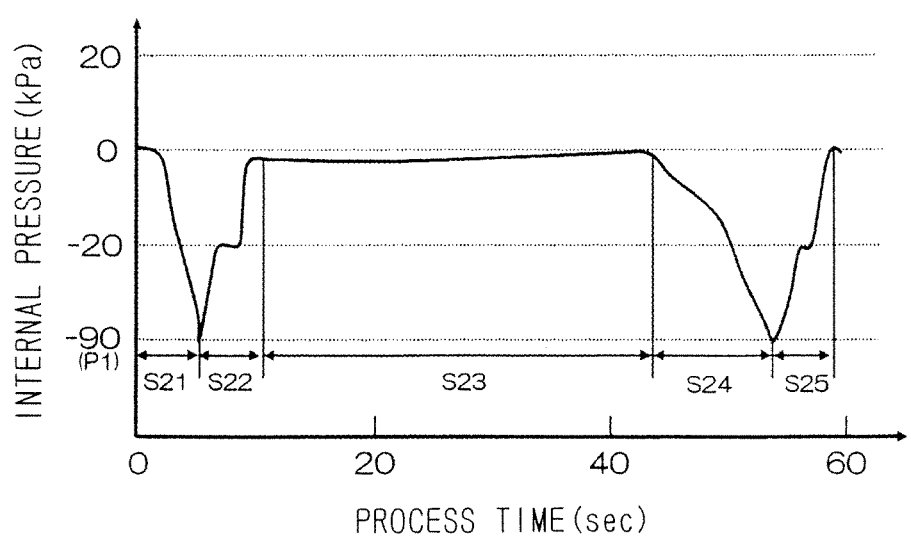
FIG. 7 is a graph showing change in internal pressure in the processing chamber associated with the process steps shown in FIG. 6.

Steps S21, S22 and S23 shown in FIG. 6 (second embodiment) are essentially the same as Steps S11, S12 and S13 shown in FIG. 4 (first embodiment), and thus the description thereof is omitted.

After completion of step S23, the solvent vapor-containing atmosphere is discharged from the processing chamber 10 (step S24 in FIG. 6). In the second embodiment, the target pressure in step S24 is set to be identical to the target pressure P1 in step S21; while the gas discharge rate R2 in step S24 is set to be smaller than the gas discharge rate R1 in step S21. As the internal space of the processing chamber is evacuated slowly and thus rapid evaporation of the solvent, or the thinner, having penetrated in the resist film is suppressed, undesirable deformation of the resist film and/or development of defects in the resist film can be prevented. The gas discharge rate R2 is determined in view of the above. In the illustrated embodiment, the gas discharge rate R2 in step S24 is 30 L/min, while the gas discharge rate R2 in step 21 is 100 L/min.

After the internal pressure of the processing chamber 10 is reduced to the target pressure P1, N$_2$ gas is supplied into the processing chamber 10 so that the internal pressure of the processing chamber 10 is returned to the standard pressure (step S25 in FIG. 6). Thus, the atmosphere in the processing chamber 10 is replaced. Note that, in the second embodiment, since the target pressure in step S24 is low (in comparison with the first embodiment), repetition of steps S24 and S25 is not necessary.

According to the second embodiment, the gas discharge rate R1, or the pressure reducing rate, in step S21 is relatively low, rapid introduction of the solvent vapor-containing atmosphere can be established in the processing chamber 10 which contributes to improvement in throughput; and, as the gas discharge rate R2, or the pressure reducing rate, in step S24 is relatively high, undesirable deformation of the resist film and/or development of defects in the resist film can be prevented, and thus defects such as disconnections and short-circuits in the circuit pattern can be avoided.

Next, the reflow process in the third embodiment will be described in detail with reference to the cross-sectional view of the reflow unit 7 of FIG. 2, a flowchart showing process steps of the reflow process of FIG. 8, and a graph showing the change in the internal pressure with time of FIG. 9.

Figure 8:
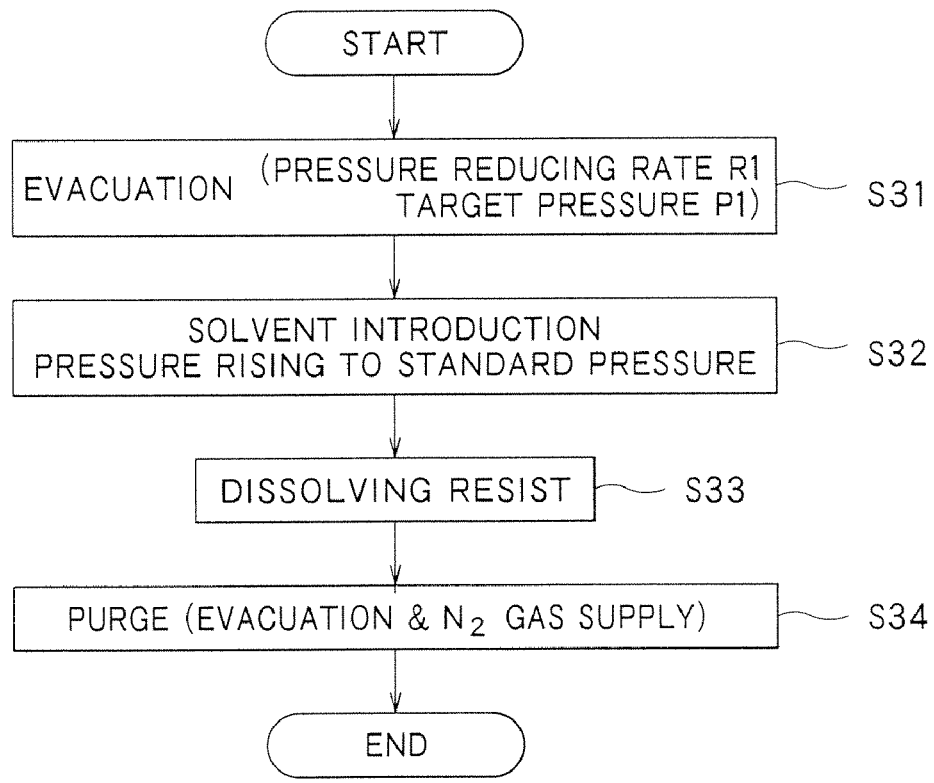
FIG. 8 is a flowchart showing process steps performed in the reflow unit of FIG. 2 in a third embodiment of the present invention.
Figure 9:
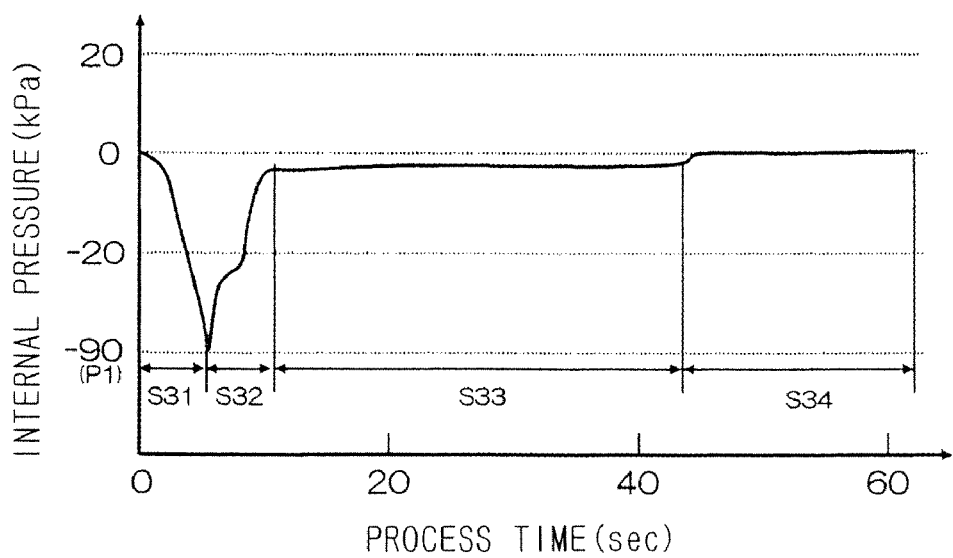
FIG. 9 is a graph showing change in internal pressure in the processing chamber associated with the process steps shown in FIG. 8.

Steps S31, S32 and S33 shown in FIG. 8 (third embodiment) are essentially the same as Steps S11, S12 and S13 shown in FIG. 4 (first embodiment), and thus the description thereof is omitted.

After completion of step S33, the solvent vapor-containing atmosphere is discharged from the processing chamber 10 (step S34 in FIG. 8). In the third embodiment, evacuation of the processing chamber 10 prior to the supply of N$_2$ gas in the processing chamber 10 is not performed. Instead, in step 34, discharging the atmosphere from the processing chamber 10 and supplying N$_2$ gas (i.e., purge gas) into the processing chamber 10 are simultaneously performed while maintaining the internal pressure of the processing chamber essentially the same, at the standard pressure, as shown in FIG. 9.

According to the third embodiment, although the time required for replacing the solvent-vapor containing atmosphere with N$_2$ gas is longer than those in the first and second embodiments, evaporation of the solvent, or the thinner, having penetrated in the resist film is prevented, since the replacement of the atmosphere is carried out under the standard pressure. Thus, undesirable deformation of the resist film and/or development of defects in the resist film can be prevented, and thus defects such as disconnections and short-circuits in the circuit pattern can be avoided.

EXAMPLES

An experiment was carried out to prove the advantage of the present invention. In the experiment, the reflow processes according to the first embodiment were performed with different second target pressures P2 in step S14 in the range of ±0 kPa to −60 kPa. In the respective reflow processes with different second target pressures P2, the number of substrates defective in the pattern was counted.

Figure 13:
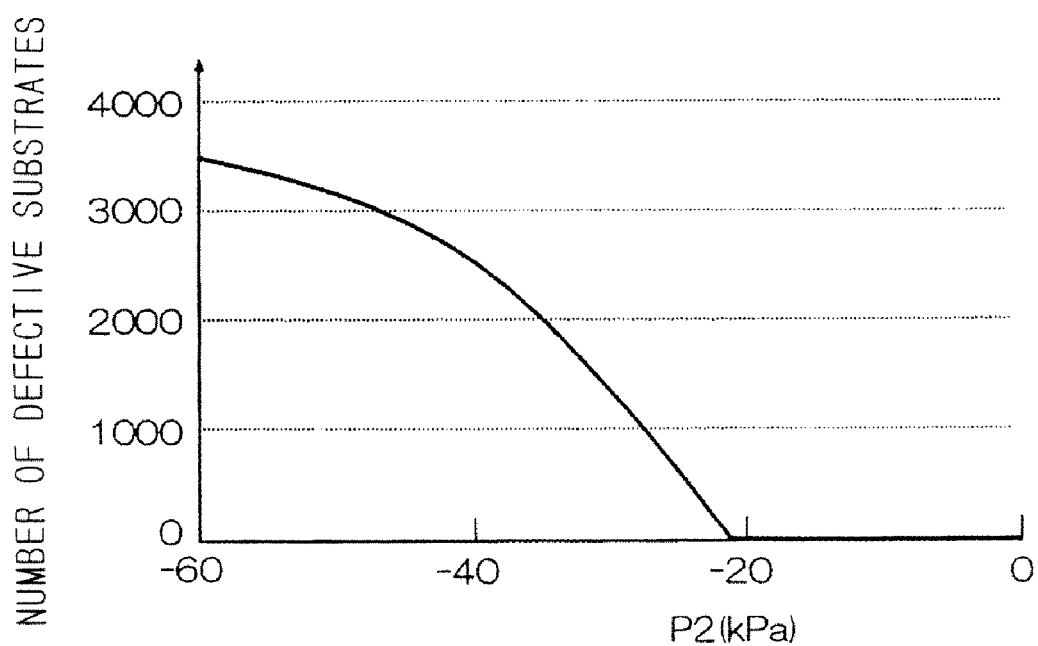
FIG. 13 is a graph showing the result of an experiment.

The experiment result is shown the graph of FIG. 13. The graph shows that: if the second target pressure P2 is in the range of 0 to −20 kPa, the defect in the pattern was not found; if the second target pressure P2 is lower than −20 kPa, the number of the defective substrates increased as the second target pressure P2 was lowered. The experiment result indicates that if the second target pressure P2 is higher than −20 kPa, patterns free of defects can be obtained.

The invention claimed is:

1. A substrate processing method that dissolves and deforms a photoresist film having a first pattern formed on a substrate to reshape the resist film into a second pattern, said method comprising the steps of:
   evacuating a processing chamber holding therein the substrate, thereby reducing an internal pressure of the processing chamber from a standard pressure to a first target pressure lower than the standard pressure;
   introducing a solvent vapor-containing atmosphere into the processing chamber, thereby bringing the internal pressure back to the standard pressure;
   dissolving the resist film by a solvent contained in the solvent vapor-containing atmosphere; and
   evacuating a processing chamber, thereby reducing the internal pressure to a second target pressure higher than the first target pressure and lower than the standard pressure and discharging the solvent vapor-containing atmosphere from the processing chamber.

2. The method according to claim 1, wherein the second target pressure minus the standard pressure is greater than −20kPa.

3. The method according to claim 1, wherein a pressure reducing rate in the step of evacuating a processing chamber to reduce the internal pressure to the first target pressure is essentially identical to that in the step of evacuating a processing chamber to reduce the internal pressure to the second target pressure.

4. The method according to claim 2, wherein a pressure reducing rate in the step of evacuating a processing chamber to reduce the internal pressure to the first target pressure is essentially identical to that in the step of evacuating a processing chamber to reduce the internal pressure to the second target pressure.

5. A substrate processing method that dissolves and deforms a photoresist film having a first pattern formed on a substrate to reshape the resist film into a second pattern, said method comprising the steps of:
   evacuating a processing chamber holding therein the substrate, thereby reducing an internal pressure of the processing chamber, at a first pressure reducing rate, from a standard pressure to a first target pressure lower than the standard pressure;
   introducing a solvent vapor-containing atmosphere into the processing chamber, thereby bringing the internal pressure back to the standard pressure;
   dissolving the resist film by a solvent contained in the solvent vapor-containing atmosphere; and
   evacuating a processing chamber, thereby reducing the internal pressure, at a second pressure reducing rate lower than the first pressure reducing rate, to the first target pressure and discharging the solvent vapor-containing atmosphere from the processing chamber.

6. A substrate processing method that dissolves and deforms a photoresist film having a first pattern formed on a substrate to reshape the resist film into a second pattern, said method comprising the steps of:
   evacuating a processing chamber holding therein the substrate, thereby reducing an internal pressure of the processing chamber from a standard pressure to a first target pressure lower than the standard pressure;
   introducing a solvent vapor-containing atmosphere into the processing chamber, thereby bringing the internal pressure back to the standard pressure;
   dissolving the resist film by a solvent contained in the solvent vapor-containing atmosphere; and
   discharging the solvent vapor-containing atmosphere from the processing chamber without reducing the internal pressure in the processing chamber.

* * * * *